(12) United States Patent
Linga (10) Patent No.: US 8,441,032 B2
(45) Date of Patent: May 14, 2013

(54) LOW-LEVEL SIGNAL DETECTION BY SEMICONDUCTOR AVALANCHE AMPLIFICATION

(75) Inventor: Krishna Linga, Plainsboro, NJ (US)

(73) Assignee: Amplification Technologies, Inc., Brooklyn, NY (US)

( * ) Notice: Subject to any disclaimer, the term of this patent is extended or adjusted under 35 U.S.C. 154(b) by 107 days.

(21) Appl. No.: 12/825,255

(22) Filed: Jun. 28, 2010

(65) Prior Publication Data

US 2011/0018086 A1    Jan. 27, 2011

Related U.S. Application Data

(60) Provisional application No. 61/220,709, filed on Jun. 26, 2009.

(51) Int. Cl.
*H01L 31/107* (2006.01)
(52) U.S. Cl.
USPC ........... 257/186; 257/199; 257/438; 257/589; 257/603; 438/58; 438/48; 438/57; 438/154
(58) Field of Classification Search .............. 438/58, 438/48, 57, 30, 154; 257/186, 199, 438, 257/589, 603
See application file for complete search history.

(56) References Cited

U.S. PATENT DOCUMENTS

| 5,880,490 | A | 3/1999 | Antich et al. |
| 7,521,737 | B2* | 4/2009 | Augusto ....................... 257/233 |
| 2004/0097021 | A1* | 5/2004 | Augusto et al. ............... 438/149 |

FOREIGN PATENT DOCUMENTS

| WO | WO 99/05727 | 2/1999 |
| WO | WO 2004/011950 | 2/2004 |
| WO | WO 2005/048319 | 5/2005 |

OTHER PUBLICATIONS

PCT International Search Report, mailed Nov. 3, 2010, in corresponding international application No. PCT/US2010/040241, filed Jun. 28, 2010.
PCT Written Opinion of the International Searching Authority, mailed Nov. 3, 2010, in corresponding international application No. PCT/US2010/040241, filed Jun. 28, 2010.

* cited by examiner

*Primary Examiner* — Jarrett Stark
*Assistant Examiner* — John M Parker
(74) *Attorney, Agent, or Firm* — Frommer Lawrence & Haug LLP

(57) ABSTRACT

A system and method providing for the detection of an input signal, either optical or electrical, by using a single independent discrete amplifier or by distributing the input signal into independent signal components that are independently amplified. The input signal can either be the result of photo-absorption process in the wavelengths greater than 950 nm or a low-level electrical signal. The discrete amplifier is an avalanche amplifier operable in a non-gated mode while biased in or above the breakdown region, and includes a composite dielectric feedback layer monolithically integrated with input signal detection and amplification semiconductor layers.

19 Claims, 11 Drawing Sheets

LOW-LEVEL SIGNAL DETECTION BY SEMICONDUCTOR AVALANCHE AMPLIFICATION

RELATED APPLICATIONS

This application claims the benefit of U.S. Provisional Application No. 61/220,709, filed Jun. 26, 2009, which is incorporated herein by reference in its entirety.

TECHNICAL FIELD

The present invention relates generally to signal detection and, more particularly, to detecting low-level signals, such as weak optical (single photon and/or multi-photon) or electrical (single electron and/or multi-electron) signals, and to detecting weak optical signals having wavelengths higher than about 950 nm.

BACKGROUND

Sensing and detecting low-level signals in the order of single photons or single electrons presents a challenging problem even today. In these sensors, the primary signals (optical, electrical, mechanical, chemical, radiation, etc.) are transformed into elementary charge carriers, such as electrons, holes, or ions, depending on the type of the device. Signal charge packets of such elementary charge carriers are amplified and converted to a signal (e.g., to a voltage signal) that generally can be detected and/or analyzed.

High-speed sensor devices with critical threshold parameters are in an acute demand in many applications, such as those relating to laser communication, deep space communication, quantum information processing, low-level signal imaging and other monitoring devices, recording and image transfer systems, and radiation or particle detecting systems. Such applications require sensors capable of detecting and recording electrical signals that are not only weak (e.g., as few as one or several elementary charge carriers), but also short in duration and/or rapidly varying (i.e., have a large bandwidth). Accordingly, these applications require a sensor capable of amplifying such electrical signals over a wide bandwidth and with a low noise level.

At present, generally the approach that is being followed in developing sensors is having signal amplification characteristics suited for detecting and recording weak electrical signals. There are limited alternatives to this approach.

Another approach to sensing weak electrical signals is using avalanche amplification (multiplication) of signal carriers, which generally is the most sensitive and high-speed method of amplification known. As is well known, avalanche amplification is based on impact ionization arising in a strong electric field, wherein the signal carriers accelerating in an electric field ionize the atoms of the working medium of the amplifier, thus resulting in multiplication (e.g., duplication) of the signal carriers. At a high multiplication factor, however, it is difficult to stabilize the avalanche amplification operating point. Additionally, the internal (excessive) noise level and the response time grow rapidly with increasing multiplication factor. Due to these problems associated with using a large multiplication factor, traditional avalanche photodiodes use a rather low multiplication factor, M, typically less than 100, that does not allow for detecting and recording signals consisting of several electrons in a wide band.

Avalanche multiplication has also been used for recording individual ionizing particles using a Geiger-Muller counter. A particle entering such a device initiates an avalanche-like process of multiplication of the signal carriers up to a necessary recording level. More recently, this principle has been successfully used for recording single charge carriers in semiconductor avalanche-type photodiodes, often referred to as Geiger-mode avalanche photodiodes (APDs). However, this Geiger-Muller principle of amplification operates above the breakdown voltage of the semiconductor. The breakdown voltage is defined in such a way that above the breakdown voltage the avalanche process becomes self-sustaining, resulting in a run-away avalanche that cannot be stopped by itself, theoretically approaching infinite avalanche gain. Because of the infinite avalanche, during this process a new arriving signal cannot be sensed unless the avalanche is stopped. Therefore, once a signal has been generated (sensed), it is necessary to stop the avalanche so that the photodiode can be reset to detect another signal. The avalanche process can be stopped by bringing the reverse bias voltage to below the breakdown voltage. This process of bringing the reverse bias voltage below the breakdown voltage is called "quenching".

This quenching process even though faster does not bring the entire signal out of the avalanche process. It requires some time, called "dead time," typically in the order of 1-10 μsec, to stop the avalanche process to an acceptable level so that the next signal can be detected.

In addition, known Geiger Mode Avalanche diodes do not allow for distinguishing between signals of one and several input charge carriers (i.e., it does not provide high resolution of the number of charge carriers).

Therefore, there remains a need for further advancements and improvements in detecting week signals, and particularly in providing a system and method for high sensitivity and high resolution detection of signals, as well as for such high resolution detection of weak signals with a high bandwidth (faster with no dead time, but only the reset time). Additionally, there remains a need for further advancements in Geiger-mode avalanche diodes that are sensitive to wavelengths of greater than about 950 nm, and particularly, there remains a need for Geiger-mode avalanche photodiodes that are sensitive to wavelengths of about 950 nm or greater and that have a high bandwidth (e.g., low reset time) and/or high resolution (e.g., single-photon resolution).

SUMMARY OF THE INVENTION

Various embodiments of the present invention provide for detecting and sensing low-level electrical or optical signals with high speed using a self-quenching or self-reset not achievable with prior art Geiger-mode APDs. As an example, some embodiments of the present invention enable single photon detection in the wavelengths greater than 950 nm and/or at reset times lower than the present art of 1 μsec.

Various embodiments of the present invention comprise methods and devices for monolithic self-quenching of a compound semiconductor Geiger-mode avalanche diode (e.g., Geiger-mode APD) by providing a composite dielectric layer monolithically integrated with the compound semiconductor Geiger-mode avalanche diode. The compound semiconductor Geiger-mode avalanche diode may be designed with a photoabsorption region sensitive to a photon having a wavelength of about 950 nm or greater, and with an avalanche multiplication region that may be separate from the photoabsorption region. Compound semiconductors that may be employed include III-V and II-VI compounds, such as gallium arsenide (GaAs) based, indium phosphide based (InP), cadmium telluride (CdTe) based, or indium antimonide (InSb) based materials (e.g., including various ternary, quaternary, or pentanary compounds thereof, and including strained and/or unstrained layers). In view of the herein disclosure, those skilled in the art will understand how to design device structures that use such materials to provide desired characteristics, such as desired spectral characteristics (e.g., absorption of wavelengths of interest, from short-wave infrared to long-wave infrared), and that include a monolithically integrated composite dielectric layer to provide for monolithic quenching, in accordance with various embodiments of the present invention.

The monolithically integrated composite dielectric layer (which may comprise one or more contiguous dielectric layers) provides negative feedback for quenching the avalanche process, thereby providing for self-quenching and allowing for free-running, continuous operation without requiring an external circuit for quenching or gated operation. The monolithically integrated composite dielectric layer has a negligible conductance and provides negative feedback for quenching the avalanche process predominantly through capacitive feedback. The monolithically integrated composite dielectric layer may include one or more of silicon nitride, silicon oxide, silicon carbide, silicon oxynitride (SiON), and silicon oxycarbide (SiOC), and in some embodiments one or more of these dielectrics may be deposited as silicon rich. The monolithically integrated composite dielectric layer may be a thin film layer (which may comprise one or more thin film layers) deposited directly on the p-type compound semiconductor region(s) or the n-type compound semiconductor region(s) of the p-n or p-i-n structure that forms the avalanche diode. In various alternative embodiments, the monolithically integrated thin film composite dielectric layer may be deposited directly onto a high electrical conductivity layer that directly contacts the p-type compound semiconductor region(s) or the n-type compound semiconductor region(s) of the p-n or p-i-n structure that forms the avalanche diode. For example, this intervening high electrical conductivity layer onto which the composite dielectric layer is directly deposited may be a metal layer or a heavily doped semiconductor layer of the same dopant type as the underlying, directly contacted p or n type semiconductor region(s) of the p-n or p-i-n structure that forms the avalanche diode. This intervening high electrical conductivity layer may itself comprise one or more high electrical conductivity films. (For convenience, as used herein, the term "conduct" or variants thereof (e.g., "conductive," "conductively," "conductivity") refers to electrical conductivity unless otherwise noted (e.g., thermal conductivity)).

In accordance with some embodiments, a monolithic negative feedback avalanche photodiode (APD) comprises (i) a first doped (p-type or n-type) compound semiconductor region in contact with an oppositely doped compound semiconductor region (i.e., thereby providing a p-n diode structure), or a first doped compound semiconductor region in contact with a nominally intrinsic compound semiconductor region which is in contact with a compound semiconductor region doped oppositely from the first doped semiconductor region (i.e., thereby providing a p-i-n diode structure); (ii) a composite dielectric thin film layer (which may comprise one or more dielectric thin films) having a first surface and an opposite surface, wherein the first surface of the composite dielectric thin film layer is in contact (a) with either the first doped region or the oppositely doped region, or (b) with a highly conductive layer that is in contact with either the first doped region or the oppositely doped region; and (iii) a highly conductive (e.g., metal) thin film contact layer that is in contact with the opposite surface of the dielectric thin film layer and acts as a terminal of the avalanche photodiode. More specifically, in various embodiments, the composite dielectric thin film layer has its first surface in contact with the first surface of a highly conductive layer that has an opposite surface in contact with either the first doped region or the oppositely doped region highly conductive layer, and the highly conductive layer may be implemented as one or more highly conductive thin film layers.

Some embodiments of the present invention provide a system and method providing for the detection of an input signal greater than the 950 nm wavelength by distributing the input signal into independent signal components that are independently amplified and/or amplified together. In accordance with some embodiments of the present invention, a system and method providing for the detection of an input signal comprises generating from the input signal a plurality of spatially separate elementary charge components, each having a respective known number of elementary charges, the number of the plurality of spatially separate elementary charge components being a known monotonic function of the magnitude of said input signal; and independently and/or together amplifying each of the plurality of spatially divided elementary charge components to provide a respective plurality of signal charge packets, each signal charge packet having a second number of elementary charges greater than the respective known number by a respective amplification factor.

In accordance with various embodiments of the invention, the number of the plurality of spatially separate elementary charge components is proportional to the magnitude of said input signal. Also, each of the plurality of signal charge packets has a sufficient second number of elementary charges to provide for detection thereof.

In accordance with some embodiments of the invention, the independent amplification of the plurality of spatially divided elementary charge components provides each of said plurality of signal charge packets with substantially the same said second number of elementary charges.

In accordance with some embodiments of the invention, the plurality of spatially separate elementary charge components each have substantially a same first number of elementary charges, the respective known numbers thereby each being substantially equal to said first number. This first number may be substantially equal to one to within a statistically significant metric.

In accordance with various embodiments of the present invention, the input signal may be optical or electrical. If the input signal is an optical signal, the spatially separate elementary charge components may be provided by splitting the optical signal into a plurality of photon signal packets in the wavelength greater than 950 nm. The splitting of the optical signal may be from the photon statistics of the input arriving signal and/or may be physically divided in to individual channels. If the input signal is an electrical signal, the spatially divided elementary charge components may be provided by splitting the electrical signal into each of the spatially divided elementary charge components.

In accordance with a further aspect of the present invention, the independent amplification of each of the plurality of spatially divided elementary charge components is provided by avalanche multiplication, and this may include multi-stage avalanche multiplication.

Some embodiments of the present invention comprise monolithically integrating an avalanche amplifier with a photo absorption layer operating in the wavelength range 950-1700 nm with a resistive capacitive delay layer on a single avalanche amplifier that resets the single elementary charge. In some embodiments, the capacitive delay layer is directly above the avalanche amplifier and is located within the perimeter of the amplifier or includes the perimeter of the amplifier.

Various embodiments of the present invention comprise monolithically integrating multiple avalanche amplifiers with a photo absorption layer operating in the wavelength range 950-1700 nm with resistive capacitive delay layer on these avalanche amplifiers that resets the plurality of single elementary charges.

Some embodiments of the present invention comprise a method of forming an avalanche amplifier comprising: forming an avalanche amplifier using a doped region, a multiplication region, and a charge control layer; forming a photoabsorption layer; and forming a resistive-capacitive delay layer directly above and in contact with the avalanche amplifier. The avalanche amplifier may be formed using the InP material system, the photoabsorption layer may comprise InGaAs, and the multiplication region may comprise InP.

Some embodiments of the present invention comprise a monolithic device comprising: a plurality of avalanche amplifiers formed using a doped region, a multiplication region, and a charge control layer; a photoabsorption layer; and a resistive capacitive delay layer that includes a composite dielectric and that is formed directly above the avalanche amplifiers and making physical contact to the amplifiers.

Some embodiments of the present invention provide a monolithic InP based avalanche photodiode device comprising: separate absorption and multiplication regions; a charge control layer that is disposed between (but is not necessarily adjacent to either or both of) the absorption and multiplication regions and that controls the electric field distribution between the absorption and multiplication regions; and a monolithically integrated feedback layer configured to quench the electric field in the multiplication region in response to an avalanche current being generated in the multiplication region. The monolithic InP based avalanche photodiode device may be configured such that its detection area comprises micro-pixel regions, representing separate and parallel avalanche channels. The micro-pixel regions may be formed as localized heavily-doped regions that provide for a corresponding localized electric field distribution in the multiplication region. In some embodiments, the feedback layer comprises a composite dielectric such as a silicon oxynitride (SiON), silicon oxycarbide (SiOC), silicon carbide, silicon nitride, etc. The composite dielectric layer may be formed as silicon rich. The absorption region may comprise InGaAs, such as InGaAs lattice-matched to InP, and the multiplication region may comprise InP.

In various embodiments, such a monolithic InP based avalanche photodiode device may be implemented as a discrete device or as an array. For example, a monolithic one or two-dimensional array may be formed from a plurality of such monolithic InP based avalanche photodiode devices, each providing a separate output. More specifically, some embodiments of the present invention comprise a monolithic array of InP based avalanche photodiode devices, each of the InP based avalanche photodiode devices in the array comprising separate absorption and multiplication regions; a charge control region that is disposed between (but is not necessarily adjacent to either or both of) the absorption and multiplication regions and that controls the electric field distribution between the absorption and multiplication regions; and a monolithically integrated feedback layer configured to quench the electric field in the multiplication region in response to an avalanche current being generated in the multiplication region. Each of the InP based avalanche photodiode devices in the array may provide a respective output that may be individually read. Each of the InP based avalanche photodiode devices in the array may comprise a plurality of micro-pixel regions, each micro-pixel region representing a separate and parallel avalanche channel within the respective InP based avalanche photodiode device. In various such embodiments, each InP based avalanche photodiode device in the array (e.g., each array pixel element) provides a respective output that represents a combination of each of its micro-pixel regions (i.e., the separate and parallel avalanche channels of a respective pixel in the array combine to provide the pixel's respective output).

Some embodiments of the present invention relate to the integration of various suppression techniques/methods to reduce optical/electrical cross-talk and/or after-pulsing. For example, for some embodiments of the present invention, optical isolation between micro-pixels of a discrete amplifier device or, similarly, between micro-pixels of each pixel element of an array, can be extremely important to realize the discrete amplification performance desired (e.g., in view of the direct bandgap of the InGaAs/InP epitaxial layers used in some embodiments of the present invention). The optical isolation methods include but not limited to etching of trenches between the active areas to isolate each of the active areas from adjacent active areas, filling these isolation trenches either with dielectric layer and/or organic material, forming separate p-n junctions in the place of trenches by either implantation and/or diffusion to absorb or reflect or recombine optical/electrical carriers that tend to travel to neighboring active area etc. The isolation trenches may be implemented to extend partially or entirely through one or more of the semiconductor layers of the avalanche diode device.

Some embodiments of the present invention may relate to both discretely amplifying individual micro pixels (cells) as well as amplifying some or all of the micro pixels together for a single or multiphoton input signal.

It will be appreciated by those skilled in the art that the foregoing brief description and the following detailed description are exemplary and explanatory of the present invention, but are not intended to be restrictive thereof or limiting of the advantages which can be achieved by this invention. Additionally, it is understood that the foregoing summary of the invention is representative of some embodiments of the invention, and is neither representative nor inclusive of all subject matter and embodiments within the scope of the present invention. Thus, the accompanying drawings, referred to herein and constituting a part hereof, illustrate embodiments of this invention, and, together with the detailed description, serve to explain principles of this invention.

BRIEF DESCRIPTION OF THE DRAWINGS

Aspects, features, and advantages of embodiments of the invention, both as to structure and operation, will be understood and will become more readily apparent when the invention is considered in the light of the following description made in conjunction with the accompanying drawings, in which like reference numerals designate the same or similar parts throughout the various figures, and wherein.

DESCRIPTION OF EMBODIMENTS OF THE INVENTION

Figure 1:
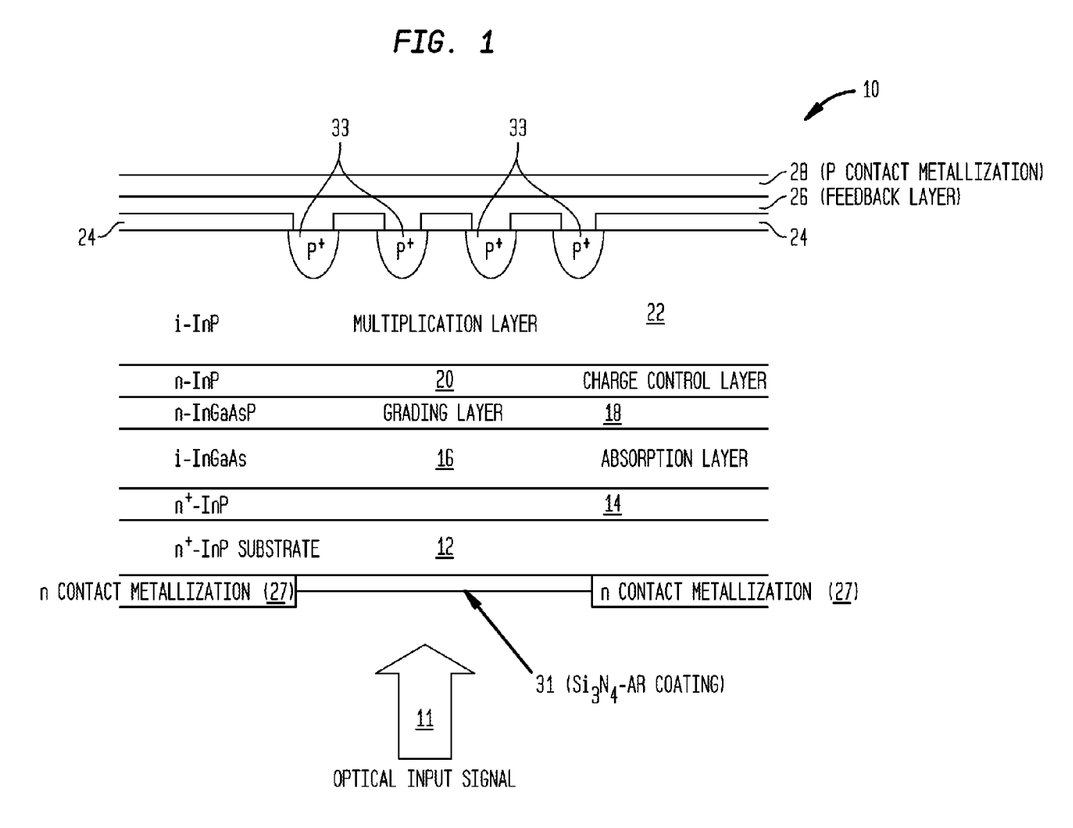
FIG. 1 schematically depicts an illustrative cross-sectional view of a discrete amplification photodetector device, in accordance with some embodiments of the present invention.

FIG. 1 schematically depicts an illustrative cross-sectional view of a discrete amplification photodetector device 10 designed using the InGaAs/InP material system, in accordance with some embodiments of the present invention. As shown, discrete amplification photodetector device 10 comprises an n-type InP ("n-InP") substrate 12, an n-InP buffer layer 14, a nominally intrinsic InGaAs absorption layer 18, a compositionally graded n-InGaAsP grading layer 18 (e.g., graded from InGaAs to InP), a n-InP charge control layer 20, a nominally intrinsic InP multiplication layer 22 in which are formed heavily doped p-type (p+) regions 33, a dielectric layer 24 (which may act as a surface passivation layer), a feedback layer 26, and contact metallizations 27 and 28.

The epitaxial layers may be grown, for example, using Metal Organic Chemical Vapor Deposition (MOCVD) or Molecular Beam Epitaxy (MBE). The starting material can be bulk InP crystal doped n-type. On top of the substrate layer 12, the first layer of n+ InP buffer layer 14 may be grown to prevent the migration of substrate defects on to the absorption layer or to the surface. In this embodiment, the second layer is a ternary Indium Gallium Arsenide (InGaAs) layer with 53% Indium and 47% Gallium, which is lattice matched to the InP buffer layer 14. The lattice matched $In_{0.53}Ga_{0.47}As$ absorption layer has a band gap of 0.73 eV at room temperature. This low bandgap energy enables the absorption (collection) of photocarriers in the 950 nm to 1700 nm spectral region. In various alternative embodiments, a quaternary (e.g., InGaAsP or InGaAlAs) or pentanary material lattice matched to InP may be used as the absorption layer; for example, to tune the bandgap to a desired cutoff wavelength. Also, in some embodiments, the absorption layer may comprise one or more strained (e.g., pseudomorphic) ternary and/or quaternary layers, which may be used for tuning the absorption characteristics of the device to the wavelengths of interest (e.g., using strained InGaAs to extend absorption to beyond about 1.7-1.8 µm, such as to about 2.6 µm).

In some embodiments, such as the depicted embodiment, a quaternary InGaAsP layer 18 may be grown on InGaAs layer 16 to reduce the bandgap discontinuity between InP charge control layer 20 and InGaAs absorption layer 16 (or, if an InP charge control layer were not used, then between InP avalanche (multiplication) layer 22 and InGaAs, e.g., layer 20 or an n-type InGaAs charge control layer grown on absorption layer 20). In some embodiments, InGaAsP layer 18 may be compositionally graded from ternary $InGa_{0.53}As_{0.48}$ to InP, with the quaternary composition controlled to avoid strain or lattice mismatch (e.g., the quaternary composition is controlled to maintain lattice matching throughout the layer). If the InP charge control layer 20 were grown directly on the absorption layer (which, in some embodiments, may be acceptable), the band discontinuity between the InP charge control region and InGaAs absorption layer would increase the hole pile up at the interface (associated with charge storage) and would create low carrier transition (affecting recombination) and cause increased rise and fall time. As such, providing the grading layer 18 improves device performance.

Following deposition of the grading layer 18, an n-type InP charge control layer 20 is grown, and then the final epitaxial layer is grown as nominally intrinsic InP layer 22, which is the layer in which avalanche multiplication occurs during operation of the device 10. Charge control layer 22 is designed to control the electric field in the device, e.g., to provide for a low electric field in the InGaAs absorption layer 16 while a high electric field is provided in the avalanche multiplication layer 22. As noted above, in various alternative embodiments, charge control layer 20 may alternatively be implemented as n-InGaAs, lattice matched to absorption layer 16. As will be understood by those skilled in the art, various alternative materials (e.g. other lattice-matched ternary, quaternary, or pentanary compositions) may be used for the charge control layer and generally, this layer should be designed to avoid breakdown thereof (e.g., avalanche therein) during operation of the device (e.g., wider bandgap materials may be preferred).

Following the epitaxial depositions described above, the fabrication of the InP/InGaAs internal discrete amplification photodiode 10 proceeds with the deposition of a dielectric layer 24, which may be implemented as $Si_3N_4$ deposited, for example, using Plasma Enhanced Chemical Vapor Deposition (PECVD). Formation of a high quality interface between the top surface of InP avalanche layer 22 and $Si_3N_4$ dielectric layer 24 is important for reducing surface leakage current. Providing such a high quality interface (e.g., by preparing the surface prior to $Si_3N_4$ deposition, controlling the $Si_3N_4$ dielectric layer 24 deposition to minimize film stress, etc., as known to those skilled in the art), reduces the surface states at this interface and thus reduces the over all dark count of the final device.

After the deposition of the silicon nitride dielectric layer 24, diffusion windows are opened in the silicon nitride layer 24 for the 'p' type carrier diffusion to fabricate p-n junctions in the InP avalanche layer 22. The windows may be opened using photolithography and dry (e.g., plasma) etching of the silicon nitride layer in the windows formed in the photoresist. After the etching of the silicon nitride, p+ regions 33 may be formed using a conventional 'p' type carrier diffusion process, with the diffusion process parameters (e.g., diffusion temperature and time, etc.) being optimized to control the depth of the p-n junction from the surface to achieve accurate positioning of the junction in the InP avalanche region.

After the p+ diffusion, the feedback layer 26 that maintains the constant gain is deposited using standard deposition methods such as PECVD, LPCVD, EBEAM, magnetron sputtering etc. Examples of materials that may be used for feedback layer 26 include silicon nitride, silicon carbide, silicon oxide, silicon oxycarbide (SiOC), silicon oxynitride (SiON), as well as other composite dielectric layers. In various embodiments, the feedback layer 26 may be formed as a silicon rich composite dielectric layer. The selected composition may depend on the material chosen, e.g., in view of the corresponding compositionally dependent characteristics of the material (e.g., dielectric properties, effective bandgap and/or band offset relative to the p+ InP, etc.) and of its capacitive feedback characteristics during device operation. As will be understood by those skilled in the art, the feedback layer 26 is designed (e.g., thickness and material selection in view of the relative dielectric constant) to provide a desired feedback capacitance in view of the overall device design, considering, for example, the junction capacitance of the avalanche diode structure at an operating reverse bias voltage, the reverse bias voltage dependent gain, etc. By way of non-limiting example, feedback layer 26 may have a thickness from about 0.1 microns (μm) to about 2.0 μm, and, depending on the material, may have a relative dielectric constant of about 2.0 to 8.0.

After depositing the feedback layer 26, it may be patterned through photolithography and dry etching down to the silicon nitride dielectric layer 24, to remove it from regions outside the active area of avalanche photodiode. After patterning the feedback layer 26, then 'p' contact metallization 28 may be formed. More specifically, for example, after removing the photoresist used to pattern the feedback layer 26, 'p' contact metallization 28 may be patterned using a liftoff process (i.e., patterning the photoresist, depositing p contact metal using, e.g. e-beam evaporation, and then removing the photoresist (and thus the overlying metal)).

The 'p' metal 28 connects all the micro-pixels (corresponding to the p+ diffusions) within a device and thus results in the signal from each individual micro cell being combined (added together). As will be understood by those skilled in the art, in various embodiments as depicted in FIG. 1, p metal contact 28, composite dielectric feedback layer 26, and the p+ diffusions provide a capacitive structure comprising the feedback capacitance that provides for quenching the APD during operation, with the electric field through composite dielectric feedback layer 26 being predominantly in the vertical direction (normal to the plane of the thin film dielectric layer 26), along the same direction as the electric field through the APD with which it is monolithically integrated, the monolithically integrated feedback capacitance thus being in series with the APD junction capacitance.

After the 'p' metal deposition, the wafer can be back lapped and polished using a chemo-mechanical polishing method. After the polishing, an anti-reflection coating 31 (e.g., silicon nitride) may be deposited on the back side of the wafer and an 'n' contact metal 27 may be deposited using Electron Beam (EBeam) evaporation or thermal evaporation or sputtering of, for example, AuGeNi/Au or AuSn alloy metals. The lift-off technique may also be used to selectively pattern the 'n' metal to open the windows to provide for backside illumination of the device (e.g., represented by optical input signal 11).

Figure 2:
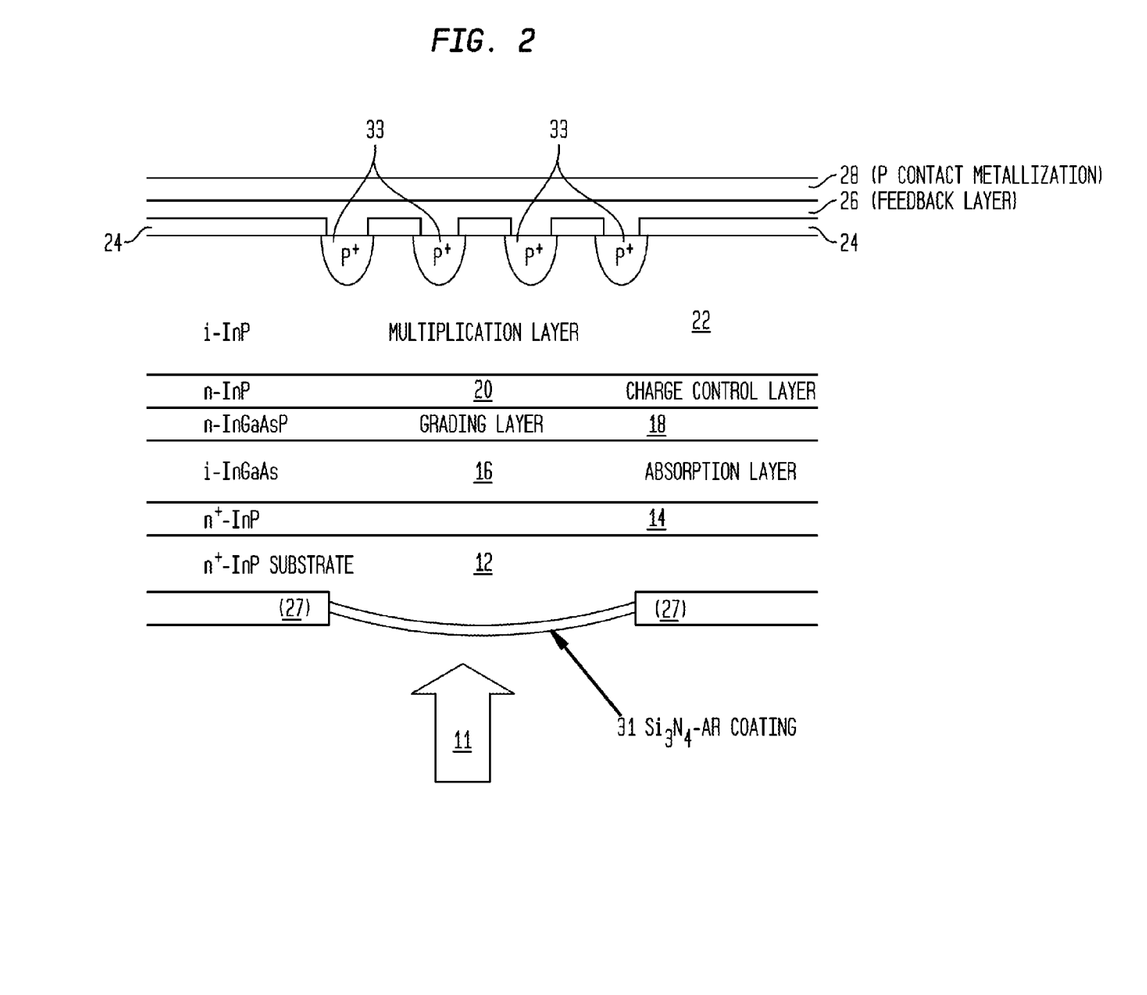
FIG. 2 schematically depicts an illustrative cross-sectional view of a discrete amplification photodetector device, in accordance with some embodiments of the present invention.

FIG. 2 schematically illustrates an InGaAs/InP based discrete amplification device cross section similar to that of FIG. 1, but also including a monolithically integrated lens formed in the InP substrate in the open window region where the device receives an optical input signal to be amplified.

As will be appreciated from the foregoing embodiments, the device comprises a separate $In_{0.53}Ga_{0.47}As$ absorption layer. In various implementations, the device may be designed and operated such that when the absorption layer is fully depleted, the electric field strength is about $6-8\times10^4$ V/cm. Such an electric field prevents tunneling current that has a threshold field of $1.5\cdot10^5$ V/cm in InGaAs layer, while also providing a high velocity of free carriers close to the saturation velocity ($E>10^4$ V/cm).

In various implementations of the cross sectional device shown in FIGS. 1 and 2, the thickness of the absorption layer may be selected as about 1 μm to enable the absorption (>75% quantum efficiency) for 1.06 to 1.6 μm wavelength region. In various implementations, the devices can have front side illumination and/or backside illumination (e.g., the frontside metallization and feedback layer may be transparent to the wavelengths of interest). An $In_{0.53}Ga_{0.47}As$ absorption layer provides high absorption coefficients up to wavelength of 1.7 μm. As indicated above, if device operation is required for wavelengths up to the 1.3 μm, an InGaAsP absorption layer may be used instead of InGaAs absorption layer to increase the band gap. An increase in bandgap provides for lower leakage current, which results in a lower dark count rate in the overall device. As also indicated above, use of the InGaAsP grading layer reduces the hole pile-up at valence band discontinuity, enabling operation at higher frequencies.

In various implementations, the charge control layer and the multiplication layer parameters may be optimized to achieve high gain, high speed and increase the avalanche efficiency. In addition, the multiplication layer thickness may be selected to define the operating bias voltage of the device and to help reduce the operating bias voltage. By way of example, the charge control layer thickness may be about 1 μm thick and the multiplication layer thickness may be about 2 μm. Such illustrative thicknesses for these layers provide for higher device operating voltage.

A potential disadvantage of some implementations that use a planar design with a guard ring approach is that the density of the cells will be lower and lead to the lower geometrical factor (g). This means that not all photo generated carriers will be multiplied, i.e., carriers that are absorbed below the guard ring area are lost. An example of the effective diameter of the uniform area per cell is 21 μm, thus corresponding circle (effective square) is 346 μm², while full square per cell (for hexagonal packing of cells) is 512 μm² for step of 32 μm, this corresponds to geometrical factor g=346/512=0.675. Thus, the detection efficiency ($P_d$) for such a design may be estimated as:

$$P_d = g \times (1\text{-reflection}) \times (\text{absorption efficiency}) \times (\text{avalanche probability})$$
$$= 0.67 \times 0.85 \times 0.85 \times 0.85 \approx 0.41$$

The avalanche probability is the probability of a photo carrier that transits to the multiplication region and results in a detectable output signal pulse. This value may be considered as the efficiency of the discrete amplifier similar to any semiconductor Geiger mode device. To make the geometrical factor higher one should increase the cell size which decreases the number of cells in the final device thus leading to lower dynamic range.

In various alternative device designs there are no guard rings to suppress the edge breakdown, but the design may be used to increase efficiency of the free carrier generation. It is important to note that only carriers moving from the bulk absorption layer are multiplied, while carriers generated close to the semiconductor-insulator interface, are not multiplied. This provides for reducing the surface generation at the InP—$Si_3N_4$ interface, while preserving high quantum efficiency.

The effective square diameter may be estimated as 6.2 μm (effective square 30 μm$^2$ per cell), while full square for step 8 μm (for hexagonal packing of cells) is 32 μm, thus g≈0.9. This may increase the detection probability up to 50-55%.

Some benefits of having small cell size include wider dynamic range, lower cell-to-cell optical coupling, and wider bandwidth due to small cell capacitance.

Figure 3:
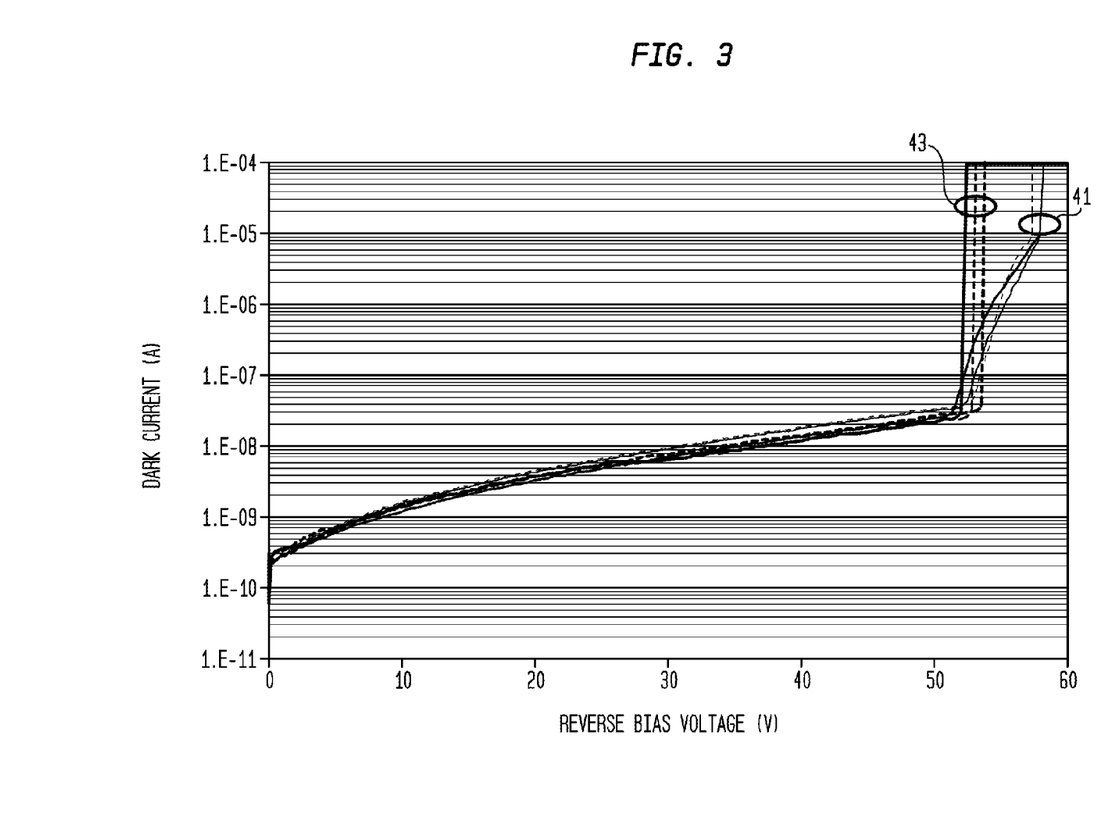
FIG. 3 shows an illustrative comparison of the measured dark current characteristics for an InGaAs/InP discrete avalanche amplification detector having a feedback layer according to some embodiments of the present invention and for an InGaAs/InP discrete avalanche amplification detector not having a feedback layer.
Figure 4:
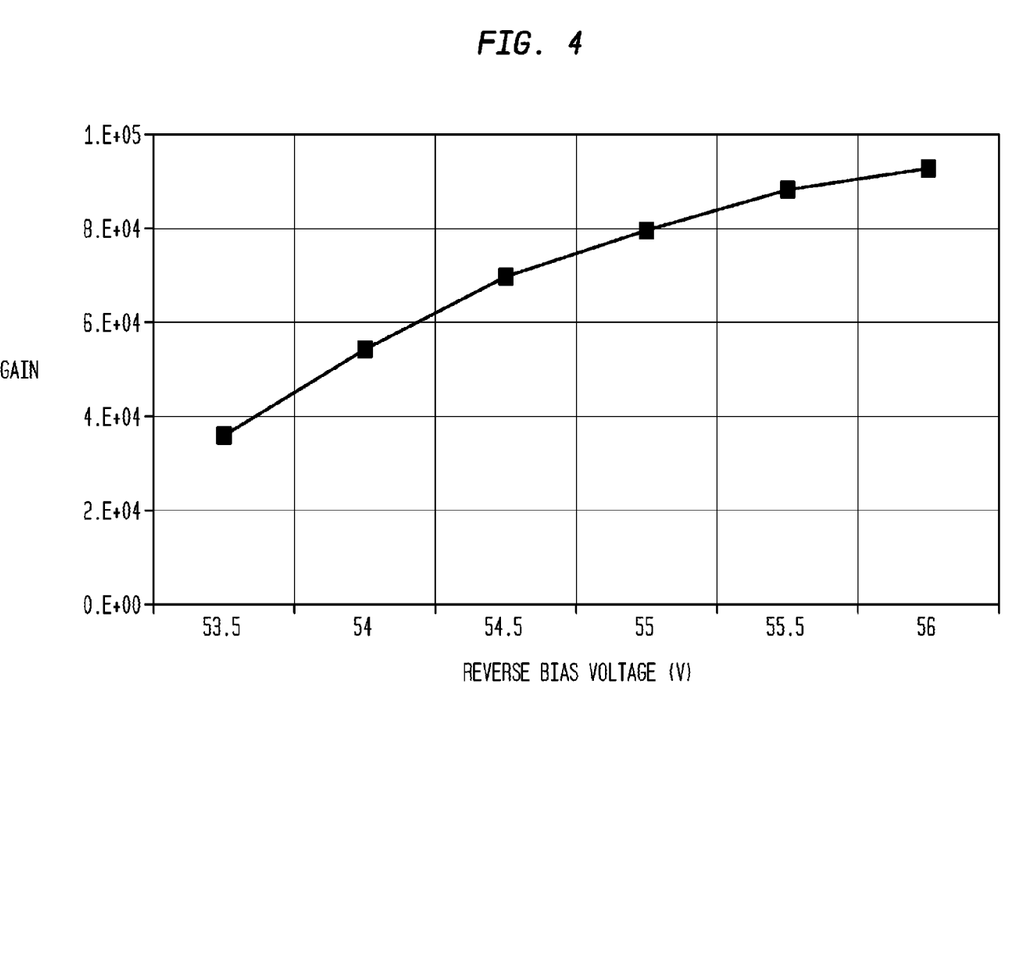
FIG. 4 shows an illustrative measured gain characteristic for an InGaAs/InP discrete avalanche amplification detector having a feedback layer according to some embodiments of the present invention.
Figure 5:
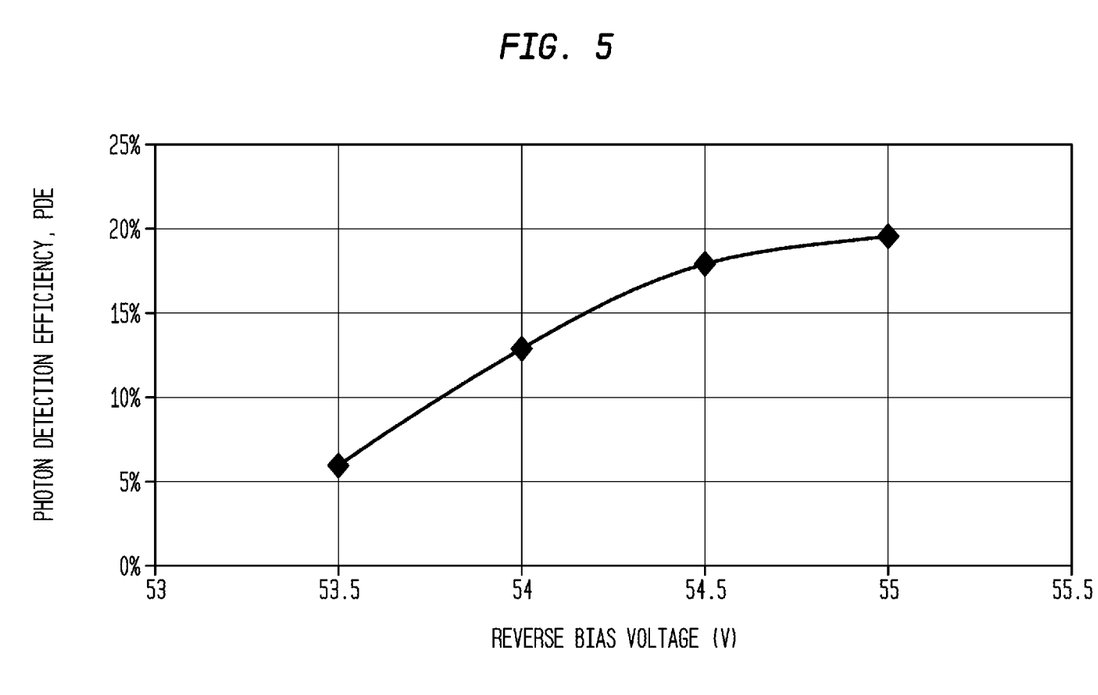
FIG. 5 shows an illustrative measured Photon Detection Efficiency (PDE) characteristic for an InGaAs/InP discrete avalanche amplification detector having a feedback layer according to some embodiments of the present invention.
Figure 6:
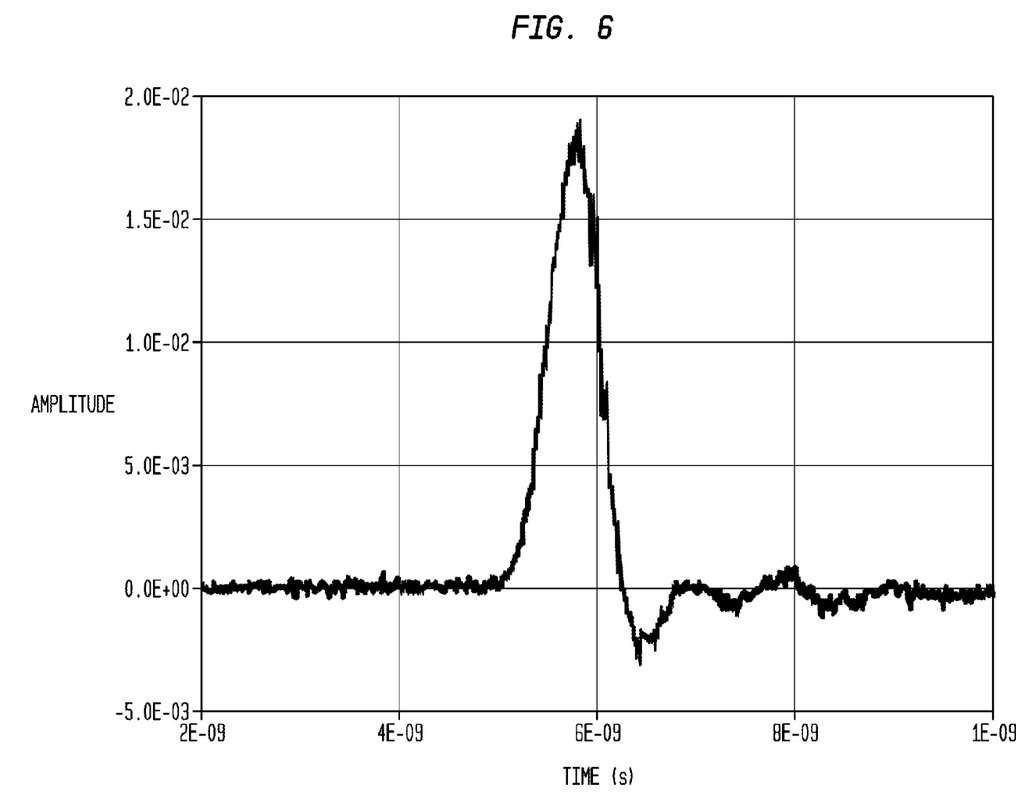
FIG. 6 shows an illustrative measured Single Electron Response (SER) characteristic for an InGaAs/InP discrete avalanche amplification detector having a feedback layer according to some embodiments of the present invention.

By way of example only, FIGS. 3-6 show various measured characteristics for an InGaAs/InP discrete avalanche amplification detector similar to the structure shown in FIG. 1, and employing a 0.3 μm thick composite dielectric feedback layer, which had a silicon rich composition with about 15% C and about 10% O. More specifically, FIG. 3 shows the measured dark current characteristics (41) of the InGaAs/InP discrete avalanche amplification detector similar to the structure shown in FIG. 1 (41) (i.e., including the feedback layer) compared to the measured dark current characteristics (43) for a similar device that did not include a monolithically integrated feedback layer. As may be seen from this figure, the feedback layer increases the operating bias voltage beyond the breakdown voltage, which is a unique feature in low-level detection devices. For this InGaAs/InP discrete avalanche amplification detector which employed a 0.3 μm composite dielectric feedback layer, FIG. 4 shows an illustrative measured gain characteristic for the InGaAs/InP, FIG. 5 shows an illustrative measured Photon Detection Efficiency (PDE), and FIG. 6 shows an illustrative measured Single Electron Response (SER) characteristic.

Figure 7:
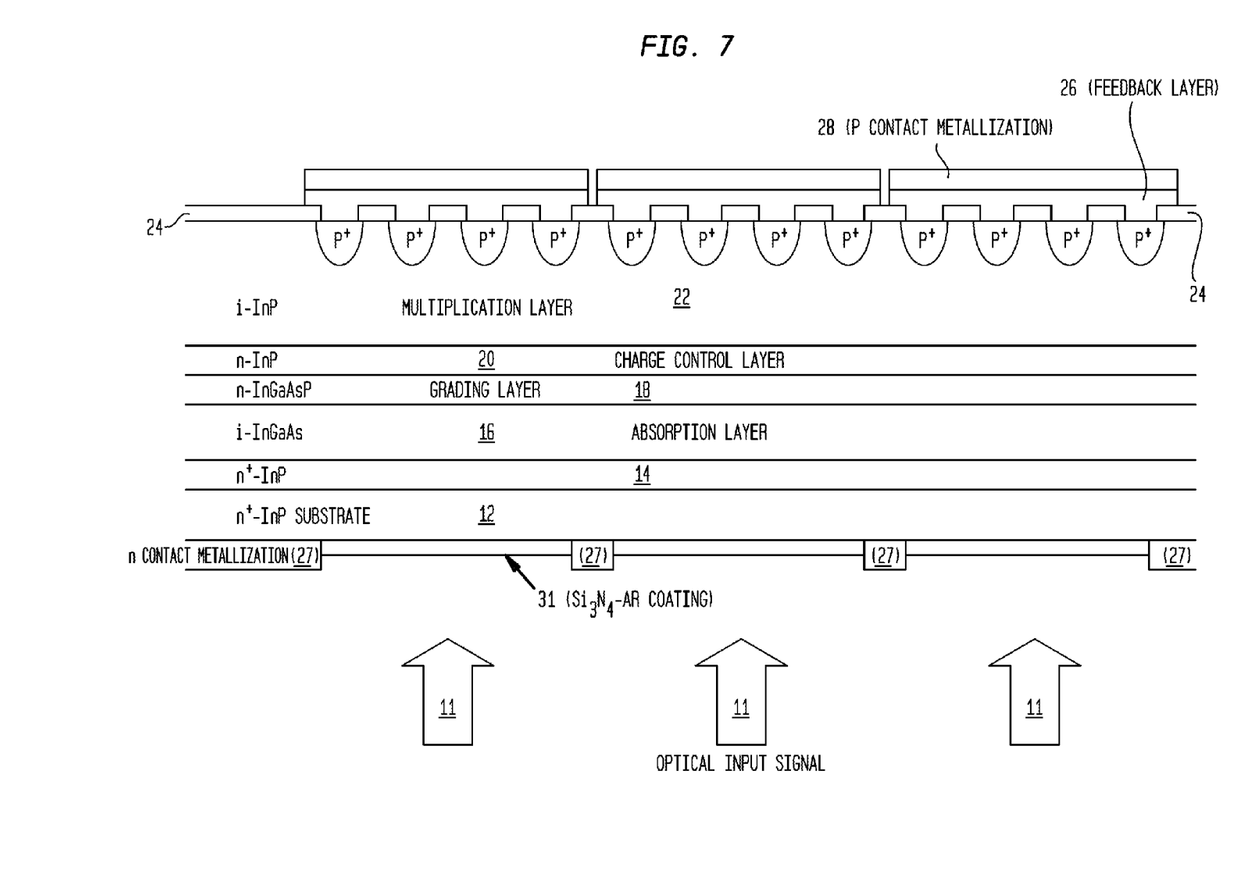
FIG. 7 schematically depicts an illustrative cross-sectional view of a discrete amplification photodetector array device, in accordance with some embodiments of the present invention.
Figure 8:
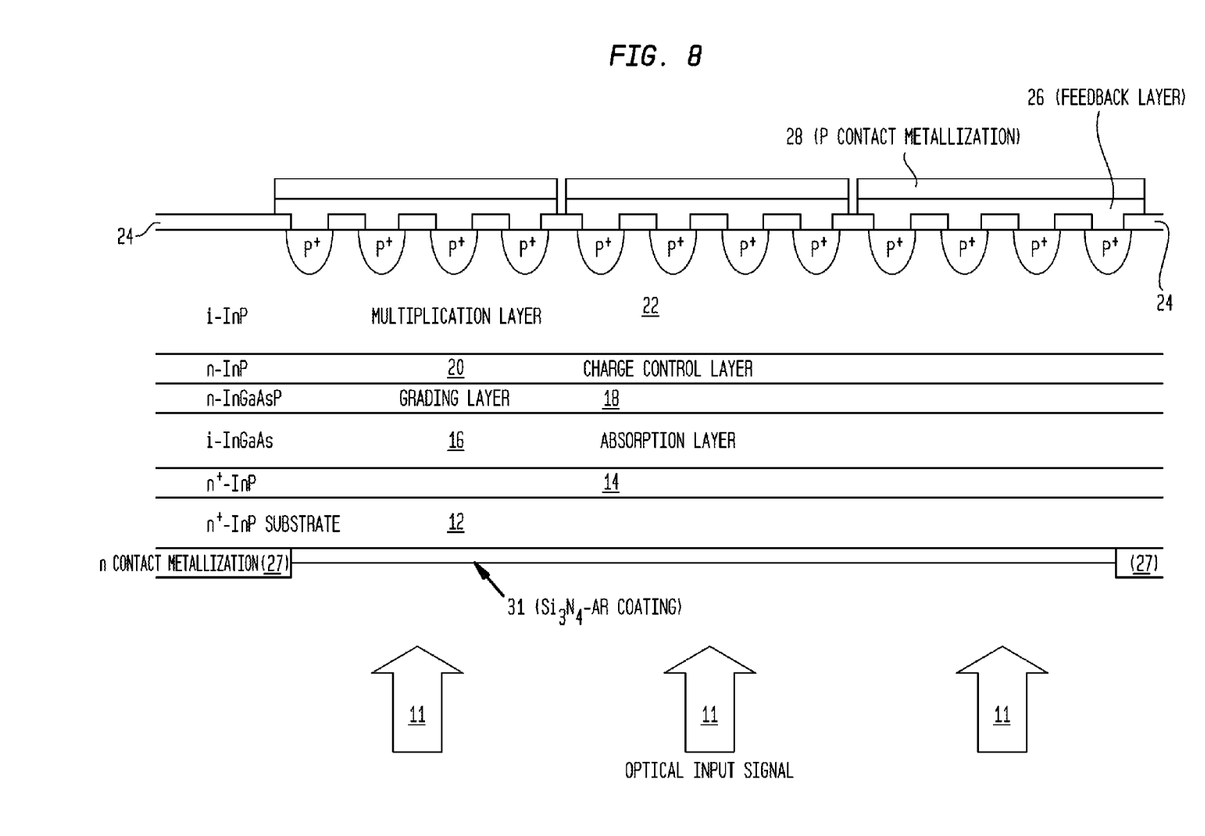
FIG. 8 schematically depicts an illustrative cross-sectional view of a discrete amplification photodetector array device, in accordance with some embodiments of the present invention.

As indicated above, in accordance with various embodiments of the present invention, compound semiconductor Geiger-mode APDs having a monolithically integrated dielectric feedback layer may be implemented as an array. For example, FIGS. 7 and 8 schematically depict cross-sectional views of illustrative alternative embodiments of a discrete amplification photodetector array device, in accordance with some embodiments of the present invention. As shown, in the array of FIG. 7, backside contact metallization 27 is disposed in the inter-pixel (inter-element) regions, whereas in the array of FIG. 8 the backside contact metallization is not disposed between the inter-pixels but at the outside periphery of the array active region. As will be understood, compared to the embodiment shown in FIG. 8, the embodiment shown in FIG. 7 may have less inter-pixel crosstalk, but reduced fill-factor. It will also be understood, that in accordance with various alternative embodiments, the embodiment shown in FIG. 7 may be modified to include backside microlenses in each pixel (e.g., each lens being similar to the backside lens depicted in the embodiment of FIG. 2).

Some embodiments of the present invention relate to the integration of various suppression techniques/methods to reduce optical/electrical cross-talk and/or after-pulsing. For example, for some embodiments of the present invention, optical isolation between micro-pixels of a discrete amplifier device or, similarly, between micro-pixels of each pixel element of an array, can be extremely important to realize the discrete amplification performance desired (e.g., in view of the direct bandgap of the InGaAs/InP epitaxial layers used in some embodiments of the present invention). Additionally, while in some embodiments such isolation may not be extremely important, such isolation may nonetheless be provided.

Some illustrative inter-micro-pixel isolation techniques (e.g., to reduce optical and/or electrical cross-talk and/or after-pulsing) include but are not limited to (i) etching of trenches between the active areas to isolate each of the active areas from adjacent active areas, (ii) etching such isolation trenches and filling them with dielectric material and/or organic material, (iii) etching such trenches and forming separate p-n junctions in the trench region by either ion implantation and/or diffusion and possibly also filling the trenches with dielectric and/or organic material, and (iv) instead of etching such trenches, forming separate p-n junctions in the inter-micro-pixel regions by either implantation and/or diffusion. As will be understood by those skilled in the art, such isolation techniques may be implemented to, for example, absorb (e.g., by providing potential sink) or reflect (e.g., by providing a potential barrier) or recombine (e.g., by providing excess carriers of opposite type) optical and/or electrical carriers that tend to travel to neighboring active area.

Figure 9:
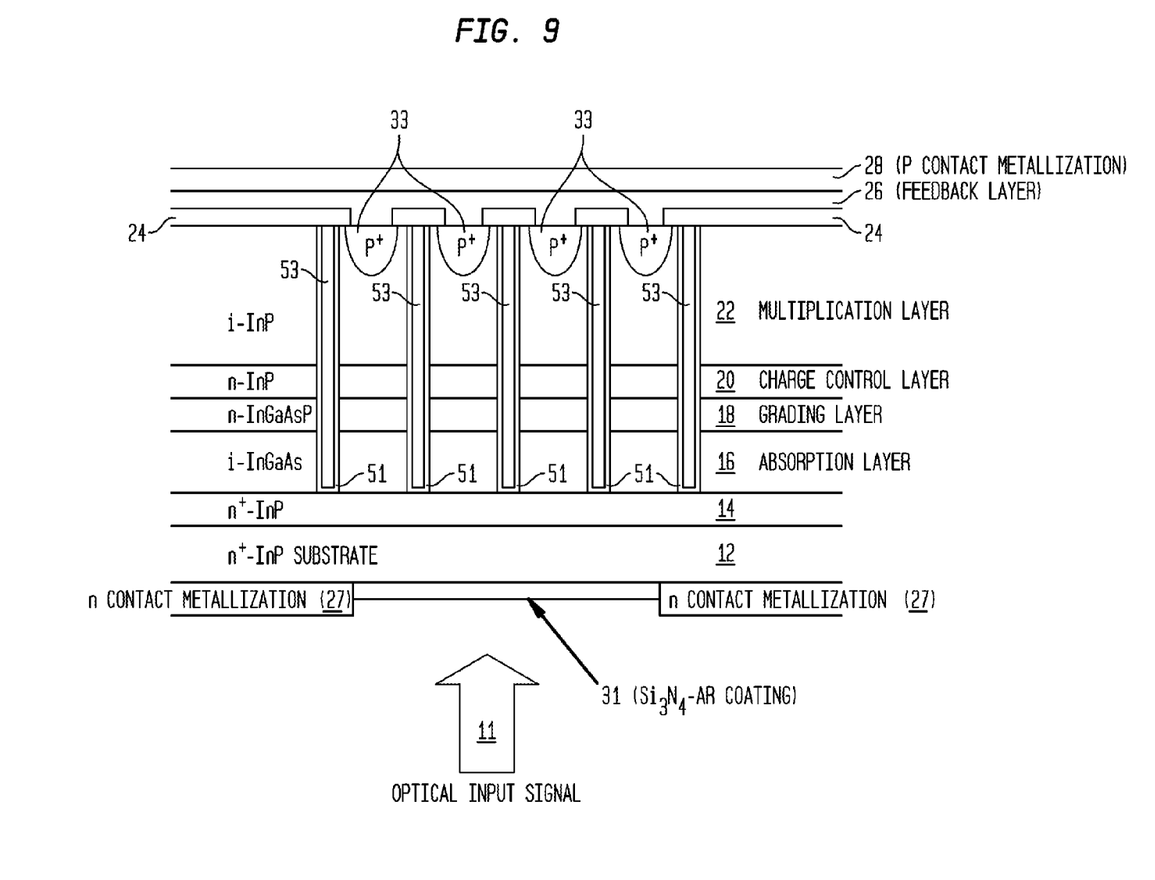
FIGS. 9-11 schematically depict illustrative cross-sectional views of a discrete amplification photodetector that include various illustrative implementations of inter-micropixel isolation in accordance some embodiments of the present invention.
Figure 10:
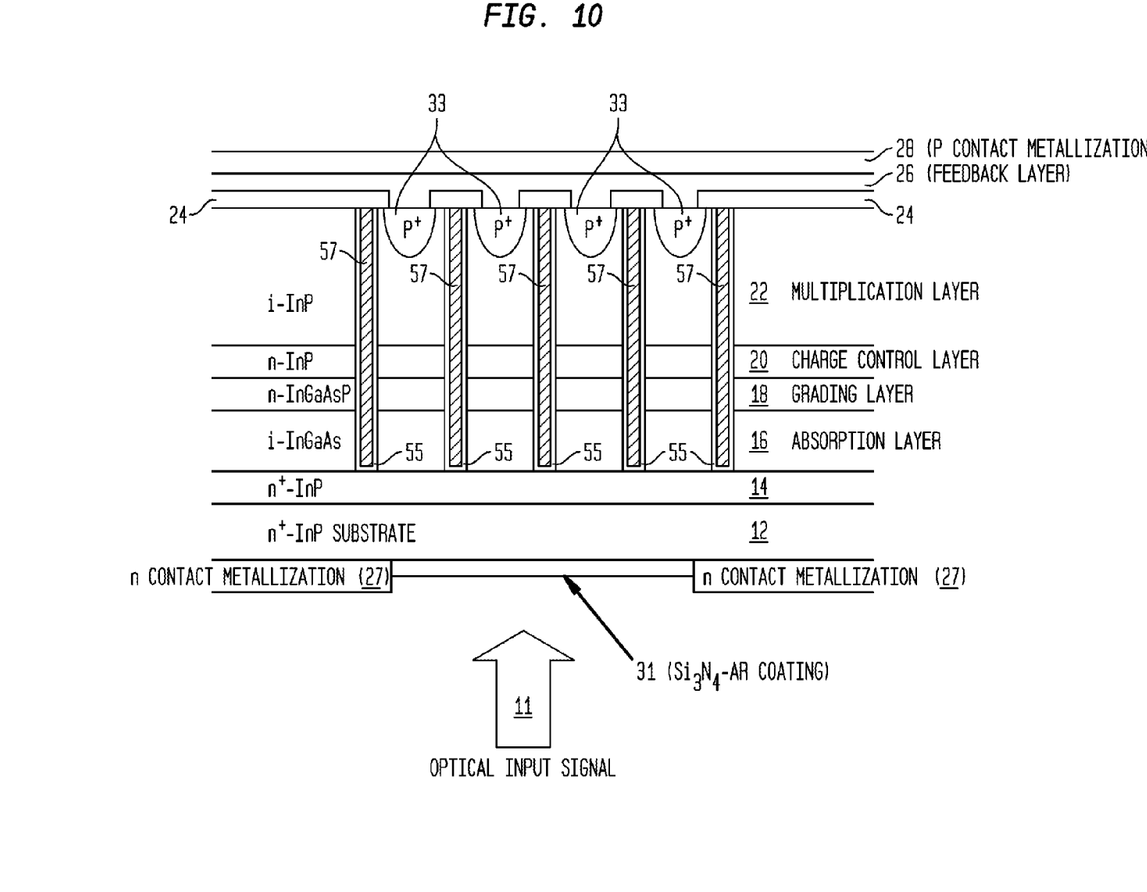
Figure 11:
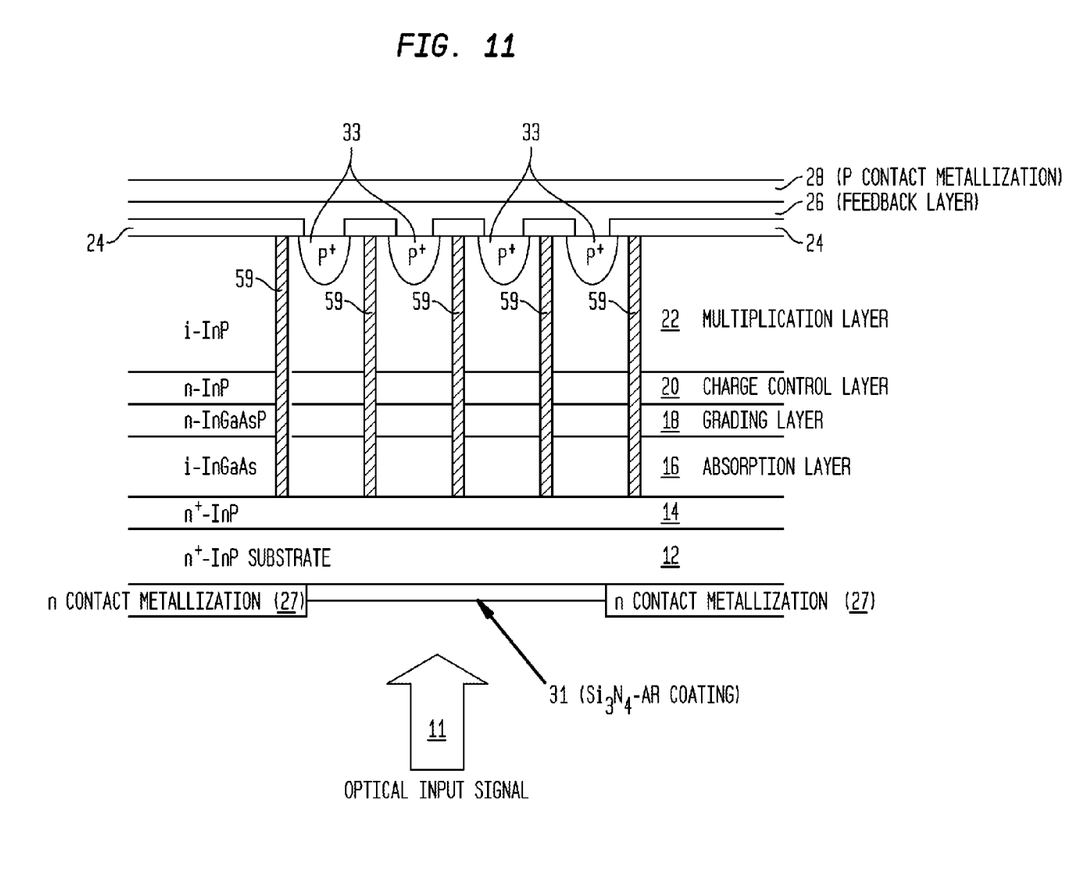

Some of these illustrative inter-micro-pixel isolation techniques are schematically depicted in FIGS. 9-11. More specifically, FIG. 9 shows inter-pixel-isolation regions formed as trenches in which a first dielectric layer 51 (e.g., silicon nitride) is deposited, while trench region 53 is unfilled. FIG. 10 shows an alternative implementation of inter-pixel-isolation regions formed as trenches in which a first dielectric layer 55 (e.g., silicon nitride) is deposited, followed by deposition of a second material 57, which may be another dielectric (e.g., $SiO_x$) or an organic material. FIG. 10 shows yet another illustrative alternative implementation, in which inter-pixel-isolation regions are formed by heavily doping regions 59 (e.g., to form p-n junctions) using ion implantation or diffusion techniques.

As will be understood by those skilled in the art, while the illustrative isolation regions depicted in FIGS. 9-11 extend through each of the epitaxial layers except for the n+ InP buffer layer 14, in various alternative implementations of these and other isolation techniques, the isolation regions may be implemented to extend partially or entirely through one or more of any of the semiconductor layers (e.g., including buffer layers, such as buffer layer 14) of the avalanche diode device.

The present invention has been illustrated and described with respect to specific embodiments thereof, which embodiments are merely illustrative of the principles of the invention and are not intended to be exclusive or otherwise limiting embodiments. Accordingly, although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, except to the extent necessary or inherent in the processes themselves, no particular order to steps or stages of methods or processes described in this disclosure, including the figures, is implied. In many cases the order of process steps may be varied, and various illustrative steps and/or material layers may be combined, altered, or omitted, and various steps and/or material layers may be added, without changing the purpose, effect or import of the methods and devices described. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with the claims that follow.

What is claimed is:

1. A Geiger-mode detector device operable for detecting a low-level input signal, the device comprising:
    at least one compound semiconductor layer configured to provide an avalanche p-n or p-i-n junction;
    a first electrically conductive electrode and a second electrically conductive electrode operable to provide a voltage bias across said avalanche p-n or p-i-n junction;
    a composite dielectric layer disposed between one of said first and second electrodes and the at least one compound semiconductor layer;
    wherein the device is configured to be operable in a Geiger mode such that with said voltage bias biasing the avalanche p-n or p-i-n junction in or above the breakdown region said composite dielectric layer provides negative feedback for quenching the avalanche process predominantly through capacitive feedback; and
    wherein the at least one compound semiconductor layer comprises (i) a photoabsorption region sensitive to a photon having a wavelength of at least about 950 nm or greater, the Geiger-mode detector device thereby being implemented as a Geiger-mode avalanche photodiode (APD) device, and (ii) an avalanche multiplication region that is separate from the photoabsorption region.

2. The Geiger-mode detector device according to claim 1, wherein said composite dielectric layer provides for quenching of the avalanche process without requiring gated operation of the device.

3. The Geiger-mode detector device according to claim 1, wherein the composite dielectric layer has negligible conductance.

4. The Geiger-mode detector device according to claim 1, wherein the composite dielectric layer comprises one or more of silicon nitride, silicon oxide, silicon carbide, silicon oxynitride (SiON), and silicon oxycarbide (SiOC).

5. The Geiger-mode detector device according to claim 4, wherein at least one of the one or more dielectrics comprising the composite dielectric layer is formed as silicon rich.

6. The Geiger-mode detector device according to claim 1, wherein the composite dielectric layer is a thin film layer deposited directly on the doped portion of the avalanche p-n or p-i-n junction.

7. The Geiger-mode detector device according to claim 1, wherein the at least one compound semiconductor layer and the electrodes are configured as a monolithic array of APD elements.

8. The Geiger-mode detector device according to claim 7, wherein the at least one compound semiconductor layer and the electrodes are configured such that each APD element provides a respective output that is capable of being read individually.

9. A Geiger-mode detector device operable for detecting a low-level input signal, the device comprising:
    at least one compound semiconductor layer configured to provide an avalanche p-n or p-i-n junction;
    a first electrically conductive electrode and a second electrically conductive electrode operable to provide a voltage bias across said avalanche p-n or p-i-n junction;
    a composite dielectric layer disposed between one of said first and second electrodes and the at least one compound semiconductor layer; and
    a conductive thin film layer deposited directly on the doped portion of the avalanche p-n or p-i-n junction, and wherein the composite dielectric layer is deposited directly on the highly conductive thin film layer;
    wherein the device is configured to be operable in a Geiger mode such that with said voltage bias biasing the avalanche p-n or p-i-n junction in or above the breakdown region said composite dielectric layer provides negative feedback for quenching the avalanche process predominantly through capacitive feedback.

10. The Geiger-mode detector device according to claim 9, wherein the at least one compound semiconductor layer comprises a photoabsorption region sensitive to a photon having a wavelength of at least about 950 nm or greater, the Geiger-mode detector device thereby being implemented as a Geiger-mode avalanche photodiode (APD) device.

11. The Geiger-mode detector device according to claim 9, wherein the at least one compound semiconductor layer comprises an avalanche multiplication region that is separate from the photoabsorption region.

12. A Geiger-mode detector device operable for detecting a low-level input signal, the device comprising:
    at least one compound semiconductor layer configured to provide an avalanche p-n or p-i-n junction;
    a first electrically conductive electrode and a second electrically conductive electrode operable to provide a voltage bias across said avalanche p-n or p-i-n junction;
    a composite dielectric layer disposed between one of said first and second electrodes and the at least one compound semiconductor layer;
    wherein the device is configured to be operable in a Geiger mode such that with said voltage bias biasing the avalanche p-n or p-i-n junction in or above the breakdown region said composite dielectric layer provides negative feedback for quenching the avalanche process predominantly through capacitive feedback;
    wherein the at least one compound semiconductor layer comprises a photoabsorption region sensitive to a photon having a wavelength of at least about 950 nm or greater, the Geiger-mode detector device thereby being implemented as a Geiger-mode avalanche photodiode (APD) device; and
    wherein the at least one compound semiconductor layer and the electrodes are configured as a discrete APD.

13. A Geiger-mode detector device operable for detecting a low-level input signal, the device comprising:
    at least one compound semiconductor layer configured to provide an avalanche p-n or p-i-n junction;
    a first electrically conductive electrode and a second electrically conductive electrode operable to provide a voltage bias across said avalanche p-n or p-i-n junction;
    a composite dielectric layer disposed between one of said first and second electrodes and the at least one compound semiconductor layer;
    wherein the device is configured to be operable in a Geiger mode such that with said voltage bias biasing the avalanche p-n or p-i-n junction in or above the breakdown region said composite dielectric layer provides negative feedback for quenching the avalanche process predominantly through capacitive feedback;
    wherein the at least one compound semiconductor layer comprises a photoabsorption region sensitive to a photon having a wavelength of at least about 950 nm or greater, the Geiger-mode detector device thereby being implemented as a Geiger-mode avalanche photodiode (APD) device;

wherein the at least one compound semiconductor layer and the electrodes are configured as a monolithic array of APD elements; and wherein each APD element comprises a plurality of micro-pixel regions, each micro-pixel region corresponding to a separate and parallel avalanche channel within the respective APD element, the output signal generated by each respective APD element representing the combination of signals generated by the micro-pixel regions within the respective APD element.

14. The Geiger-mode detector device according to claim 13, further comprising inter-micro-pixel isolation structures including at least one of (i) trenches formed between active areas, the trenches filled with at least one of a dielectric layer and an organic material, and (ii) p-n junctions formed between active areas.

15. The Geiger-mode detector device according to claim 14, wherein the inter-micro-pixel isolation structures extend at least partially through one or more of the at least one compound semiconductor layers.

16. A Geiger-mode detector device operable for detecting a low-level input signal, the device comprising:

at least one compound semiconductor layer configured to provide an avalanche p-n or p-i-n junction;

a first electrically conductive electrode and a second electrically conductive electrode operable to provide a voltage bias across said avalanche p-n or p-i-n junction;

a composite dielectric layer disposed between one of said first and second electrodes and the at least one compound semiconductor layer;

wherein the device is configured to be operable in a Geiger mode such that with said voltage bias biasing the avalanche p-n or p-i-n junction in or above the breakdown region said composite dielectric layer provides negative feedback for quenching the avalanche process predominantly through capacitive feedback; and wherein the at least one compound semiconductor layer comprises (i) separate photoabsorption and avalanche multiplication regions, (ii) a charge control layer that is disposed between the photoabsorption and avalanche multiplication regions and that controls the electric field distribution between the photoabsorption and avalanche multiplication regions, and wherein said composite dielectric layer is operable to quench the electric field in the multiplication region in response to an avalanche current being generated in the multiplication region.

17. A Geiger-mode detector device operable for detecting a low-level input signal, the device comprising:

at least one compound semiconductor layer configured to provide an avalanche p-n or p-i-n junction;

a first electrically conductive electrode and a second electrically conductive electrode operable to provide a voltage bias across said avalanche p-n or p-i-n junction;

a composite dielectric layer disposed between one of said first and second electrodes and the at least one compound semiconductor layer;

wherein the device is configured to be operable in a Geiger mode such that with said voltage bias biasing the avalanche p-n or p-i-n junction in or above the breakdown region said composite dielectric layer provides negative feedback for quenching the avalanche process predominantly through capacitive feedback; and wherein the at least one compound semiconductor layer and the electrodes are configured as a discrete APD comprising a plurality of micro-pixel regions, each micro-pixel region corresponding to a separate and parallel avalanche channel within the discrete APD, the output signal generated by the discrete APD representing the combination of signals generated by the micro-pixel regions within the discrete APD.

18. The Geiger-mode detector device according to claim 17, further comprising inter-micro-pixel isolation structures including at least one of (i) trenches formed between active areas, the trenches filled with at least one of a dielectric layer and an organic material, and (ii) p-n junctions formed between active areas.

19. The Geiger-mode detector device according to claim 18, wherein the inter-micro-pixel isolation structures extend at least partially through one or more of the at least one compound semiconductor layers.

* * * * *